(12) United States Patent
Yun et al.

(10) Patent No.: US 11,239,353 B2
(45) Date of Patent: Feb. 1, 2022

(54) SEMICONDUCTOR DEVICE AND METHOD OF MANUFACTURING THE SAME (71) Applicant: ELECTRONICS AND TELECOMMUNICATIONS RESEARCH INSTITUTE, Daejeon (KR)

(72) Inventors: Sun Jin Yun, Daejeon (KR); Kwang Hoon Jung, Changwon-si (KR); So Hyun Kim, Daejeon (KR); Jung Wook Lim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/670,412

(22) Filed: Oct. 31, 2019

(65) Prior Publication Data

US 2020/0144405 A1 May 7, 2020

(30) Foreign Application Priority Data

Nov. 1, 2018 (KR) .................. 10-2018-0132739
Oct. 23, 2019 (KR) .................. 10-2019-0132561

(51) Int. Cl.
  *H01L 31/00* (2006.01)
  *H01L 29/76* (2006.01)
  *H01L 29/06* (2006.01)
  *H01L 29/786* (2006.01)
  *H01L 21/02* (2006.01)
  *H01L 29/04* (2006.01)

(52) U.S. Cl.
  CPC .... *H01L 29/7606* (2013.01); *H01L 21/02568* (2013.01); *H01L 21/02614* (2013.01); *H01L 29/045* (2013.01); *H01L 29/0657* (2013.01)

(58) Field of Classification Search
  CPC .............. H01L 29/1606; H01L 29/267; H01L 29/41766; H01L 29/78681
  See application file for complete search history.

(56) References Cited

U.S. PATENT DOCUMENTS 9,887,303 B2   2/2018  Heo et al.
2008/0135825 A1  6/2008  Lee et al.
(Continued)

FOREIGN PATENT DOCUMENTS

KR   10-2017-0078222 A   7/2017

OTHER PUBLICATIONS

Inyeal Lee et al., "Gate-Tunable Hole and Electron Carrier Transport in Atomically Thin Dual-Channel WSe2/MoS2 Heterostructure for Ambipolar Field-Effect Transistors", Advanced Materials, pp. 9519-9525, 2016.
(Continued)

*Primary Examiner* — Brian Turner
(74) *Attorney, Agent, or Firm* — Rabin & Berdo, P.C.

(57) ABSTRACT

Provided is a method of manufacturing a semiconductor device. The method includes providing a substrate, forming uneven portions in a region of the substrate in which an electrode is to be formed, forming a precursor film formed of a two-dimensional material on the substrate on which the uneven portions are formed, forming a metal chalcogen film by performing a chalcogenation process on the formed precursor film, and forming the electrode on the formed metal chalcogen film.

12 Claims, 7 Drawing Sheets

(56) References Cited

U.S. PATENT DOCUMENTS

| | | | |
|---|---|---|---|
| 2015/0122315 A1* | 5/2015 | Shin | H01L 29/0665 |
| | | | 136/255 |
| 2016/0035568 A1 | 2/2016 | Chung et al. | |
| 2017/0345944 A1* | 11/2017 | Lin | H01L 29/1606 |
| 2018/0269291 A1* | 9/2018 | Lin | H01L 29/1054 |
| 2019/0067005 A1* | 2/2019 | Yun | C23C 16/305 |
| 2020/0006541 A1* | 1/2020 | Lin | H01L 21/02521 |
| 2020/0083359 A1* | 3/2020 | Pillarisetty | H01L 29/78681 |

OTHER PUBLICATIONS

Keng-Ku Liu et al., "Growth of Large-Area and Highly Crystalline MoS2 Thin Layers on Insulating Substrates", NANO letters, pp. 1538-1544, Dec. 2012.

Kibum Kang et al., "High-mobility three-atom-thick semiconducting films with wafer-scale homogeneity", Nature, vol. 520, pp. 656-660, Apr. 30, 2015.

\* cited by examiner

SEMICONDUCTOR DEVICE AND METHOD OF MANUFACTURING THE SAME

CROSS-REFERENCE TO RELATED APPLICATION

This U.S. non-provisional patent application claims priority under 35 U.S.C. § 119 of Korean Patent Application No. 10-2018-0132739, filed on Nov. 1, 2018, and Korean Patent Application No. 10-2019-0132561, filed on Oct. 23, 2019, the entire contents of which is hereby incorporated by reference.

BACKGROUND

The present disclosure relates to a semiconductor device and a method of manufacturing the same, and more particularly, to a semiconductor device having improved contact resistance between an electrode and a semiconductor and a method of manufacturing the same.

A material of which atoms are bonded by strong ionic or covalent bonds in one layer while layers are bonded through van der Waals forces so that the layers are easily exfoliated is commonly referred to as a two-dimensional material.

A two-dimensional material has very high carrier mobility because interactions between layers are week and charges are mainly moved and transported within one layer.

In such a two-dimensional material, electron transport in a direction parallel to the layers is very advantageous but electron transport in a direction perpendicular to the layers is very disadvantageous. Therefore, in order to obtain an electronic device such as a field effect transistor having high mobility, there is a problem in that contact resistance between an electrode and a semiconductor channel layer is high.

SUMMARY

The present disclosure is directed to providing a semiconductor device capable of improving contact resistance between an electrode and a semiconductor using a metal chalcogenide thin film, which is a two-dimensional material in which layers, i.e., crystalline planes, are bonded through van der Waals bonds, and a method of manufacturing the same.

However, the scope of the inventive concept is not limited to the above-described objects, and other objects may present.

According to an aspect of the inventive concept, there is provided a method of manufacturing a semiconductor device including providing a substrate, forming uneven portions in a region of the substrate in which an electrode is to be formed, forming a precursor film formed of a two-dimensional material on the substrate including the uneven portions, forming a metal chalcogen film by performing a chalcogenation process on the formed precursor film, and forming the electrode on a part of the formed metal chalcogen film.

An electrode may be formed on the substrate.

The forming of the uneven portions in the region of the substrate in which the electrode is to be formed may include forming the uneven portions in a predetermined region of a surface of a dielectric film.

The forming of the two-dimensional material on the substrate on which the uneven portions are formed may include forming an ultra-thin metal film, which is a precursor of the two-dimensional material or forming an ultra-thin film of a partially oxidized metal.

The forming of the two-dimensional material on the substrate on which the uneven portions are formed may include forming the precursor film in regions including one or more contact regions and a channel region.

The resistivity of precursor films may be in the range of $1 \times 10^{-5}\ \Omega \cdot cm$-$10\ \Omega \cdot cm$.

One or more two-dimensional materials may be stacked in the contact regions.

The contact regions may include one or more two-dimensional materials among $MoS_2$, $MoSe_2$, $MoTe_2$, $WSe_2$, $WS_2$, $WTe_2$, $ZrS_2$, $ZrSe_2$, $ZrTe_2$, $HfSe_2$, $HfS_2$, $HfTe_2$, $SnS_2$, $SnSe_2$, $SnTe_2$, $InSe_2$, $InS_2$, $InTe_2$, $TiS_2$, $TiSe_2$, $TiTe_2$, $NbS_2$, $NbSe_2$, $NbTe_2$, $TaS_2$, $TaSe_2$, $TaTe_2$, $ReS_2$, $ReSe_2$, $ReTe_2$, $VS_2$, $VSe_2$, and $VTe_2$.

One or more two-dimensional materials may be stacked in the channel region.

The channel region may include one or more two-dimensional materials among $MoS_2$, $MoSe_2$, $MoTe_2$, $WSe_2$, $WS_2$, $WTe_2$, $ZrS_2$, $ZrSe_2$, $ZrTe_2$, $HfSe_2$, $HfS_2$, $HfTe_2$, $SnS_2$, $SnSe_2$, $SnTe_2$, $InSe_2$, $InS_2$, $InTe_2$, $TiS_2$, $TiSe_2$, $TiTe_2$, $NbS_2$, $NbSe_2$, $NbTe_2$, $TaS_2$, $TaSe_2$, $TaTe_2$, $ReS_2$, $ReSe_2$, $ReTe_2$, $VS_2$, $VSe_2$, and $VTe_2$.

The forming of the metal chalcogen film by performing the chalcogenation process of the formed precursor film may include forming a two-dimensional material layer including layers oriented in a direction parallel to the substrate in the channel region, and forming two-dimensional material layers oriented in a direction perpendicular to the substrate in valley portions of the contact regions.

The forming of the electrode on the formed metal chalcogen film may include forming a source electrode and a drain electrode on the contact regions.

The forming of the uneven portions in the region of the substrate in which the electrode is to be formed may include forming a lower electrode on which the uneven portions are formed in advance on the substrate.

The method of manufacturing a semiconductor device may further include forming a semiconductor layer including one or more layers on the lower electrode.

A thickness of the metal chalcogen film may range from 0.6 nm to 20 nm, and preferably, the thickness of the metal chalcogen film may range from 0.6 nm to 10 nm.

Valley portions of the uneven portions may have an angle of 120 degrees or less, and preferably, the valley portions of the uneven portions may have an acute angle less than 90 degrees.

The uneven portions may be formed by uneven portion formation induced by growing polycrystal film of high roughness, selective etching, or photolithography and wet etching.

According to another aspect of the inventive concept, there is provided a semiconductor device with improved contact resistance, which includes a substrate, uneven portions formed to correspond to a region of the substrate in which an electrode is to be formed, a metal chalcogen film formed on upper surfaces of the uneven portions, and an electrode formed on the metal chalcogen film. In this case, the metal chalcogen film is formed by performing a chalcogenation process of a precursor film of a two-dimensional material and formed on the substrate on which the uneven portions are formed.

The substrate may be formed to include one or more contact regions and a channel region.

A two-dimensional material layer including layers oriented in a direction parallel to the substrate may be formed in the channel region and layers oriented in a direction perpendicular to the substrate may be formed in valley portions of the contact regions.

The semiconductor device may further include a lower electrode formed on the substrate and a semiconductor layer including one or more layers formed on the lower electrode. The uneven portions may be formed on the lower electrode, and the electrode formed on the metal chalcogen film may be an upper electrode.

The precursor film of the two-dimensional material may be an ultra-thin metal film or an ultra-thin film formed of a partially oxidized metal.

When the substrate is a transparent substrate and the upper electrode is a transparent electrode, a device to be manufactured may be a transparent device.

When the substrate is a transparent substrate and a thin film in a region in which the uneven portions are formed is a transparent conductive layer, a device to be manufactured may be a transparent device.

When the substrate is a flexible transparent substrate and the upper electrode is a transparent electrode, a device to be manufactured may be a transparent and flexible device.

When the substrate is a flexible transparent substrate and a thin film in a region in which the uneven portions are formed is a transparent conductive layer, a device to be manufactured may be a transparent and flexible device.

According to another aspect of the inventive concept, there is provided a semiconductor device improved contact resistance, which includes a substrate, one or more electrodes formed on the substrate, and a metal chalcogen film formed on upper surfaces of the electrodes. The upper surface of the electrode may include a region in which uneven portions are formed, and include two-dimensional material layers which are formed by performing a chalcogenation process on a precursor film, which is formed on the upper surface of the electrode and the substrate, and includes the region of two-dimensional material layers oriented in a direction perpendicular to the substrate.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, embodiments of the present disclosure that are easily performed by those skilled in the art will be described in detail with reference to the accompanying drawings. However, the present disclosure may be implemented in several different forms and is not limited to embodiments described herein. In addition, parts irrelevant to description are omitted in the drawings in order to clearly explain the present disclosure. Similar parts are denoted by similar reference numerals throughout this specification.

Throughout this specification, when a part is referred to as being "connected" to another part, it includes "directly connected" and "electrically connected" via an intervening part.

Throughout this specification, when a member is referred to as being located "on" another member, it includes not only the case in which a member is in contact with another member but also the case in which a member is present between two other members.

Throughout this specification, when a part is referred to as "including" a certain component, it includes "further including" another component without excluding another component unless otherwise stated. As used throughout this specification, the terms "about," "substantially," and the like, are used at, or in the sense of, numerical values when manufacturing and material tolerances inherent in the meanings mentioned are provided and are used to prevent an unscrupulous invader from unfairly using the disclosure in which accurate or absolute figures are mentioned to aid the understanding of the present disclosure. As used throughout this specification, the terms "step to" or "step of" does not mean "step for."

The present disclosure relates to a semiconductor device in which contact resistance is improved using a two-dimensional material, and a method of manufacturing the same. Here, 'improved' means 'reduced'.

The two-dimensional material includes conductors such as graphene, insulators such as h-BN, transition metal chalcogenides such as $MoS_2$, $MoSe_2$, $WS_2$, $WSe_2$, $ReSe_2$, and the like which exhibit semiconductor characteristics, metal chalcogenides such as $SnS_2$, $SnSe_2$, InS, InSe, and the like, and metal chalcogenides that have conductor characteristics due to zero band gap energy.

Here, chalcogen refers to oxygen (O), sulfur (S), selenium (Se), tellurium (Te), or the like.

Until now, nanometer-scale thin films or nanosheets have been used in a state of having a structure in which layers are oriented in a direction parallel to a direction of a substrate. The films are in the form of an ultra-thin film having a thickness of 1 monolayer or 5 layers or less, that is, a thickness of 0.6 nm to 3.5 nm, and the layers are easily peeled off from the substrate.

In addition, even in growth using chemical vapor deposition (CVD), the focus has been on making thin films with very high crystallinity in a direction parallel to a very flat substrate.

The thin films and the graphene are used as semiconductor layers and electrodes layers, and the two-dimensional material such as h-BN is applied as a protective layer of a device.

However, as described above, the two-dimensional material is very advantageous for electron transport in a direction parallel to a layer but is very disadvantageous for electron transport in a direction perpendicular to the layer. Therefore, there is a problem in that contact resistance between an electrode and a semiconductor channel layer is high.

As one method for solving this problem, there was a contact method making edges of layers oriented parallel to a substrate such that a semiconductor contact to a conductor layer to take advantage of a property that carriers are transferred along the layer.

In addition, there were a method of lowering contact resistance by inserting a two-dimensional material, such as graphene, between a metal and a two-dimensional semiconductor and a method of lowering contact resistance by doping a contact region with the two-dimensional material.

In addition, there was a method of lowering contact resistance by changing an electrode metal material to reduce a height of a Schottky barrier, and there was a method of modifying a junction between a metal and a semiconductor.

However, all the above methods do not completely solve the problem of high contact resistance.

Meanwhile, as a method of obtaining a few-layered two-dimensional thin film, in an initial method, the two-dimensional film is obtained by being peeled off of a bulk single crystal which is naturally existing or artificially synthesized. The method is called as the tape method because a tape is used to exfoliate the layers of two-dimensional materials from bulk. However, this method cannot be used to product devices, and thus methods for manufacturing thin films are being studied.

In order to directly grow a metal chalcogenide thin film, which is a typical two-dimensional material, the metal chalcogenide thin film may be manufactured by chemical reaction between precursor vapors, such as metal oxides, and chalcogen vapors or hydrogen chalcogenide gases such as $H_2S$, or may be manufactured using a method of forming a metal thin film in advance and then chalcogenizing the metal thin film.

Among these methods, in a CVD in which a thin film of a two-dimensional material is directly grown on a substrate, an example of depositing $MoS_2$ by the CVD shows that, when S-vapors or $H_2S$ gas, is simultaneously supplied while evaporating $MoO_3$ precursor vapors and transferred onto the substrate, a $MoS_2$ film is formed on the substrate by a gas phase chemical reaction and a crystalline plane of grown $MoS_2$ is arranged in a direction parallel to the substrate.

In this process, a substrate temperature is typically in a range of 800° C. to 1,000° C., and the deposition proceeds with a process in which small singlecrystalline nuclei grow into larger crystals. Thus, it is a very difficult to form a continuous and uniform film on the substrate using this method.

Therefore, when the thin film is deposited at a very high temperature by this CVD method, transferring a selected crystalline film region to another substrate is generally used to form a device.

In addition, the deposition is performed by a method using precursor gases, such as plasma-enhanced CVD (PECVD) and atomic layer deposition (ALD). However, there is no technology developed for mass production yet. When the deposition is performed by PECVD, properties of a film are at a low quality level at which transistor properties cannot be obtained. A deposition time for depositing one layer takes 26 hours when the deposition is performed by metalorganic CVD (MOCVD).

Therefore, there is a need for a method of manufacturing a continuous and uniform two-dimensional semiconductor film at high quality on a large diameter substrate of 4 inches or larger at a substrate temperature of 600° C. or lower. To this end, in the embodiment of the present disclosure, contact resistance between an electrode and a semiconductor may be improved using a metal chalcogenide thin film, which is a two-dimensional material in which layers are bonded through van der Waals bonds.

An ultra-thin film may be formed of a two-dimensional material in a temperature range of 350° C. to 650° C. using the method used in the present disclosure. When the substrate temperature is 550° C. or lower, a transparent substrate such as glass may be used, and when the substrate temperature is 400° C. or less, a polymer flexible substrate such as polyimide may be used. The structure of the device having improved contact resistance proposed by the present disclosure is not limited by the manufacturing temperature.

Hereinafter, a semiconductor device and a method of manufacturing the same according to an embodiment of the present disclosure will be described with reference to FIGS. 1A to 7B.

FIGS. 1A to 1D are cross-sectional views for describing a process of manufacturing a semiconductor device according to an embodiment of the present disclosure.

Figure 1A:
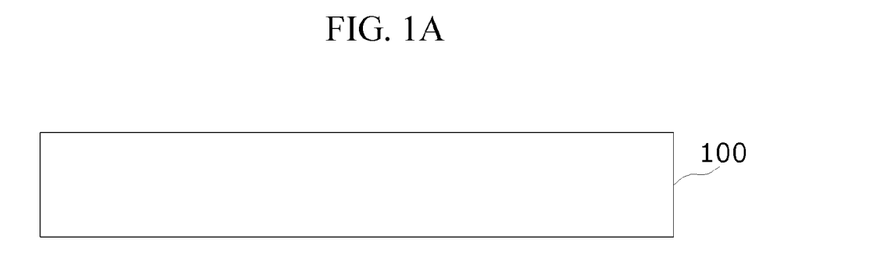
FIGS. 1A to 1D are cross-sectional views for describing a process of manufacturing a semiconductor device according to an embodiment of the present disclosure.

First, as illustrated in FIG. 1A, a substrate 100 is provided. In this case, the substrate 100 may be a substrate or a substrate on which electrodes are formed in advance. The substrate 100 may be a transparent substrate. The substrate 100 may be a flexible substrate.

Figure 1B:
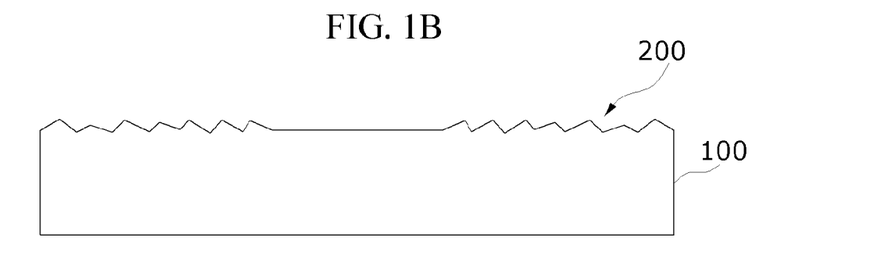

Next, as illustrated in FIG. 1B, uneven portions 200 are formed in a region of the substrate 100 on which the electrodes are to be formed. The uneven portions 200 may have a regular shape and size or may have an irregular shape and size.

Figures 1C, 1D:
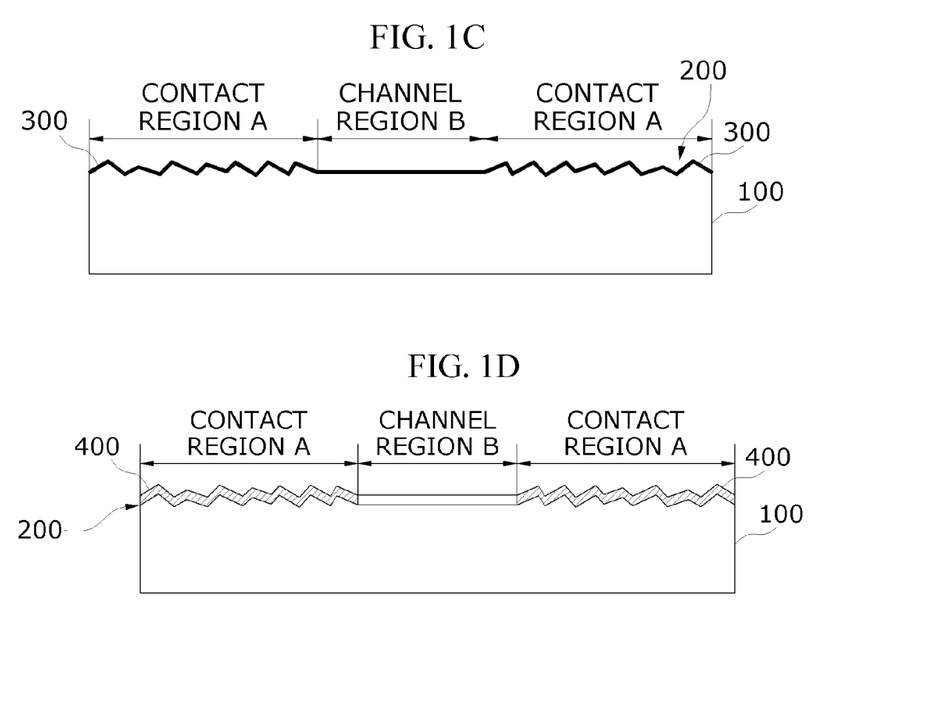

Next, as illustrated in FIG. 1C, a precursor film 300 of a two-dimensional material is formed on the substrate 100 on which the uneven portions 200 are formed. The resistivity of precursor films may be in the range of $1\times10^{-5}$ $\Omega\cdot cm$-10 $\Omega\cdot cm$. That is, an ultra-thin metal film or an ultra-thin film formed of a partially oxidized metal, which is a precursor to become a two-dimensional material, is formed on the substrate 100 on which the uneven portions 200 are formed.

In this case, the substrate 100 on which the uneven portions 200 are formed includes one or more contact regions A and a channel region B. Here, a material of a precursor in the contact region A and a material of a precursor in the channel region B may be the same or different from each other.

In an embodiment of the present disclosure, in the contact region A, one or more kinds of two-dimensional materials are stacked.

For example, the contact region A may include one or more kinds of two-dimensional materials among $MoS_2$, $MoSe_2$, $MoTe_2$, $WSe_2$, $WS_2$, $WTe_2$, $ZrS_2$, $ZrSe_2$, $ZrTe_2$, $HfSe_2$, $HfS_2$, $HfTe_2$, $SnS_2$, $SnSe_2$, $SnTe_2$, $InSe_2$, $InS_2$, $InTe_2$, $TiS_2$, $TiSe_2$, $TiTe_2$, $NbS_2$, $NbSe_2$, $NbTe_2$, $TaS_2$, $TaSe_2$, $TaTe_2$, $ReS_2$, $ReSe_2$, $ReTe_2$, $VS_2$, $VSe_2$, and $VTe_2$.

Further, in an embodiment of the present disclosure, in the channel region b, one or more kinds of two-dimensional materials are stacked.

For example, the channel region b may include one or more types of two-dimensional materials among $MoS_2$, $MoS_2$, $MoSe_2$, $MoTe_2$, $WSe_2$, $WS_2$, $WTe_2$, $ZrS_2$, $ZrSe_2$, $ZrTe_2$, $HfSe_2$, $HfS_2$, $HfTe_2$, $SnS_2$, $SnSe_2$, $SnTe_2$, $InSe_2$, $InS_2$, $InTe_2$, $TiS_2$, $TiSe_2$, $TiTe_2$, $NbS_2$, $NbSe_2$, $NbTe_2$, $TaS_2$, $TaSe_2$, $TaTe_2$, $ReS_2$, $ReSe_2$, $ReTe_2$, $VS_2$, $VSe_2$, and $VTe_2$.

For example, the channel region B may include an oxide two-dimensional material.

Next, as illustrated in FIG. 1D, a chalcogenation process is performed on the formed precursor film 300 to form a metal chalcogen film 400. In this case, in an embodiment of the present disclosure, the chalcogenation process may be performed by sulfurization, selenization, or the like.

As described above, when the chalcogenation process is performed on the ultra-thin precursor film 300 to form the metal chalcogen film 400, a crystal surface is oriented in a direction perpendicular to the substrate 100 at valley portions of the uneven portions 200 so that contact resistance is significantly reduced.

Figure 2:
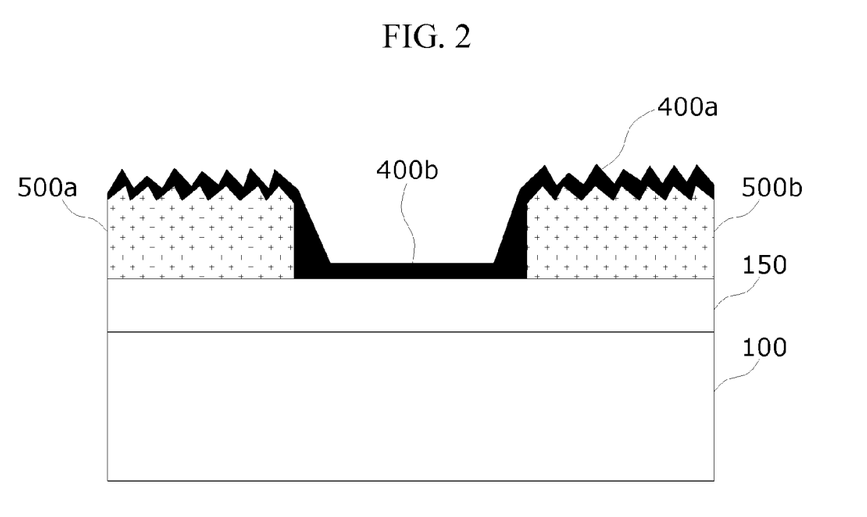
FIG. 2 is a view illustrating an example of a semiconductor device according to an embodiment of the present disclosure.

FIG. 2 is a view illustrating an example of a semiconductor device according to an embodiment of the present disclosure.

The semiconductor device according to the embodiment of the present disclosure includes a substrate 100 which is a low resistance substrate serving as a gate electrode, one or more electrodes (e.g., a source electrode 500a and a drain electrode 500b) formed on the substrate 100, and a metal chalcogen film 400a formed on upper surfaces of the electrodes. Here, the gate electrode 100 are isolated from the electrodes 500a and 500b by inserting the insulating layer 150.

According to the embodiment of the present disclosure, two-dimensional semiconductor layers 400b including layers oriented in a direction parallel to the substrate 100 are formed in a channel region, and regions, in which uneven portions are formed, are formed on upper surfaces of the electrodes 500a and 500b.

The contact region having uneven portions includes two-dimensional material layer which are formed by performing a chalcogenation process on the upper surfaces of the electrodes 500a and 500b and on a precursor film formed of a two-dimensional material formed on the substrate 100 and which are oriented in a direction perpendicular to a direction of the substrate 100.

That is, the two-dimensional semiconductor layers 400a oriented in the direction perpendicular to the direction of the substrate 100 are formed in valley regions in the contact regions having the uneven portions.

Figure 3:
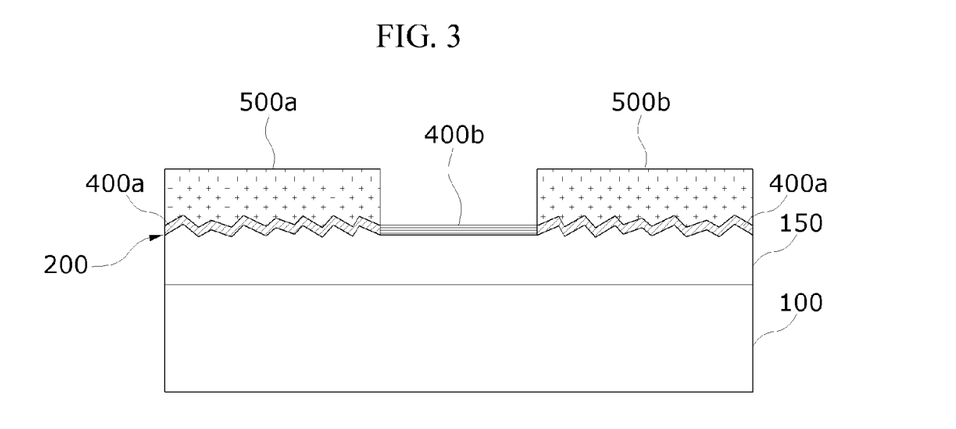
FIG. 3 is a view illustrating an example of a semiconductor device according to another embodiment of the present disclosure.

FIG. 3 is a view illustrating an example of a semiconductor device according to another embodiment of the present disclosure.

As described above, uneven portions 200 are formed in regions in which electrodes are to be formed on a substrate 100. In this case, the uneven portions 200 may be formed directly on the substrate 100 or may be formed in a predetermined region of a surface of a dielectric film 150.

A precursor film (not illustrated), such as a metal precursor or the like, is deposited on the substrate 100 or on the dielectric layer 150 in which the uneven portions 200 are formed, and then a chalcogenation process is performed thereon to form metal chalcogen films 400a and 400b.

By the above process, a two-dimensional semiconductor layer 400b including layers oriented in a direction parallel to a direction of the substrate 100 is formed in a channel region, and two-dimensional semiconductor layers 400a oriented in a direction perpendicular to the direction of the substrate 100 are formed at valley regions of contact regions having the uneven portions 200.

Further, in an embodiment of the present disclosure, charges may be collected in electrodes 500a and 500b formed on the formed metal chalcogen films 400a and 400b.

For example, in an embodiment of the present disclosure, as illustrated in FIG. 3, a source electrode 500a and a drain electrode 500b may be formed on the contact regions among regions in contact with the metal chalcogen films 400a and 400b, and thus charges flowing through a two-dimensional semiconductor channel may be effectively collected in the electrodes.

Here, the contact region may be formed of a material identical to a material of the channel region, a material different from the material of the channel region, or a mixed material of the material of the channel region and another material.

Meanwhile, in the embodiment of the present disclosure, a thickness of the layer in the contact region may range from 0.6 nm to 20 nm, and preferably, the thickness of the layer may range from 0.6 nm to 10 nm.

Figure 4:
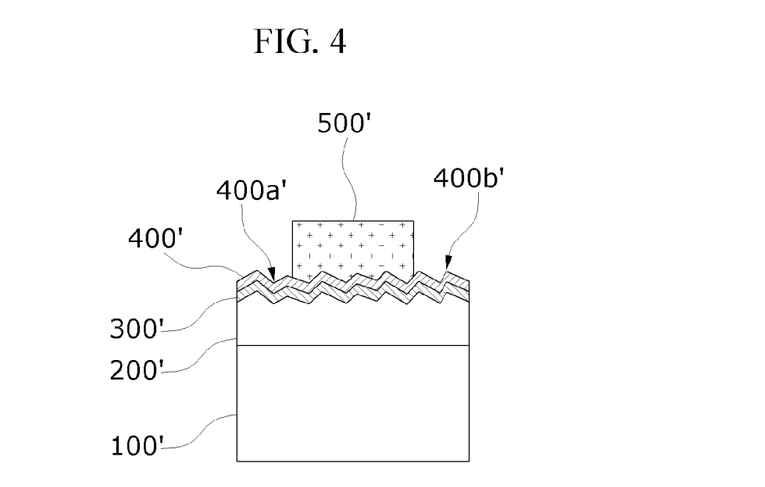
FIG. 4 is a view illustrating an example of a semiconductor device according to still another embodiment of the present disclosure.

FIG. 4 is a view illustrating an example of a semiconductor device according to still another embodiment of the present disclosure.

In still another embodiment of the present disclosure, a lower electrode 200' on which uneven portions are formed in advance may be formed on a substrate 100', and a semiconductor layer 300' may be formed on the lower electrode 200'.

In this case, the semiconductor layer 300' formed on the lower electrode 200' may be formed of one or more layers so as to operate as an element such as a p-n diode, a PIN diode, or the like.

After the lower electrode 200' and the semiconductor layer 300' are formed as described above, the above-described chalcogenation process is performed on the lower electrode 200' and the semiconductor layer 300' to form an intermediate layer 400'. In this case, the uneven portions are already formed in the lower electrode 200', and thus valley regions 400a' and peak regions 400b' are also formed in the formed intermediate layer 400'.

The intermediate layer 400' may serve as a p-type semiconductor or n-type semiconductor layer of a semiconductor device or may be used only as an intermediate layer 400' for improving contact resistance.

In this case, a thickness of the intermediate layer 400' may range from 0.6 nm to 15 nm.

More specifically, the thickness of the intermediate layer 400' may range from 0.6 nm to 10 nm.

As described above, after the intermediate layer 400' is formed, an upper electrode 500' may be additionally formed on the intermediate layer 400'.

Figure 5A:
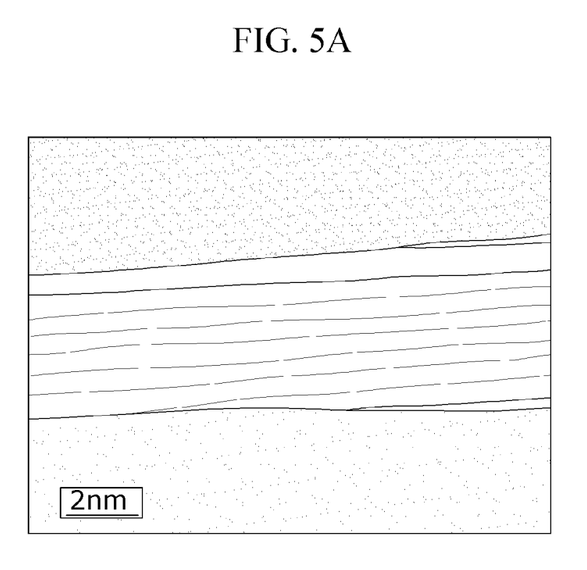
FIGS. 5A to 5C are views for describing contents for forming a two-dimensional material on a very flat surface or a surface of a low roughness.
Figure 5B:
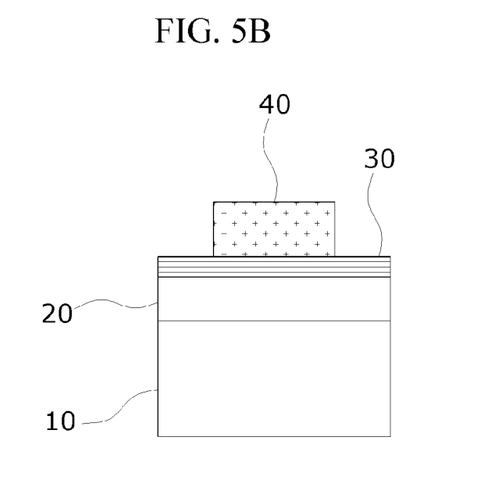
Figure 5C:
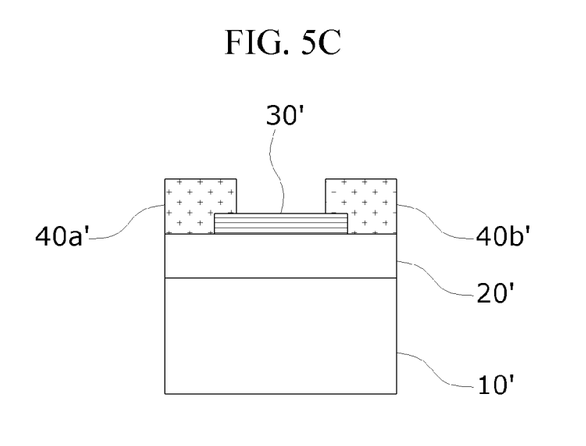

FIGS. 5A to 5C are views for describing typical schemes for forming the contact of a two-dimensional material and electrodes. In FIG. 5B, the contact resistance of horizontally aligned two dimensional planes 20 to the upper electrode 40 is high. In FIG. 5C, the thickness of two dimensional layers is less than 20 nm, the contact resistance is mainly determined by the contact area of horizontally aligned two dimensional planes to the electrodes, 40a' and 40b'.

As described above, in the embodiment of the present disclosure, a method for improving high contact resistance which is a problem of two-dimensional materials is provided.

The high contact resistance is a result of weak interaction (van der Waals bonding forces) between neighboring layers, i.e., layers in contact with an interfacing layer, which is an inherent property of a two-dimensional semiconductor. Therefore, in the embodiment of the present disclosure, crystalline planes parallel to a metal layer located therebelow are changed to be vertically oriented and to be located on a metal layer having a valley-shaped microstructure so that the contact resistance may be improved, i.e., reduced.

Generally, the crystalline planes of two-dimensional materials are formed on a substrate in a direction parallel to a direction of the substrate, similarly to a structure of nanosheets peeled off from crystals, even when being grown on the substrate by CVD, MOCVD, or the like.

FIG. 5A is a transmission electron microscopy (TEM) photograph of a cross-section of a typical $MoS_2$ thin film, FIG. 5B is a cross-sectional view of a two-dimensional material located on a lower electrode, and FIG. 5C is a view illustrating a typical cross-sectional structure of a field effect transistor.

In FIG. 5B, a lower electrode 20 is formed on a substrate 10, a two-dimensional semiconductor 30 having crystalline planes formed to be parallel to the substrate 10 is formed on the lower electrode 20, and an upper electrode 40 is formed on the two-dimensional semiconductor 30.

Similarly, in FIG. 5C, a gate dielectric 20' is formed on a substrate 10', a two-dimensional semiconductor 30' having crystalline planes formed to be parallel to the substrate 10' is formed on the gate dielectric 20', and a source electrode 40a' and a drain electrode 40b' are formed on the two-dimensional semiconductor 30'.

As illustrated in FIGS. 5A to 5C, when the typical two-dimensional semiconductors 30 and 30' in which the crystalline planes are formed to be parallel to the substrates 10 and 10' are manufactured by CVD, the structure of crystalline planes of the two-dimensional semiconductors 30 and 30' are grown in a direction parallel to the substrates 10 and 10' regardless of thicknesses thereof as illustrated in FIG. 5A.

However, when the metal precursor film is first formed and then chalcogenated as in the embodiment of the present disclosure, different results may be obtained.

That is, when chalcogen molecules react with a metal film, volume expansion inevitably occurs. For example, the density of Mo metal is 10.2 $g/cm^3$, while the densities of $MoS_2$ and $MoSe_2$ are 5.06 $g/cm^3$ and 6.90 $g/cm^3$, respectively. In order to release the stress originated from volume expansion, layers are grown to be perpendicular to the substrate when a thickness of the metal film is greater than or equal to a certain value, i.e., a critical thickness. When the layers are applied to a metal electrode junction, charges transported along the layers may be collected in the substrate or the electrode along the crystalline planes oriented perpendicular to the substrate or the electrode, thereby significantly improving contact resistance between the electrode and the semiconductor layer.

In this case, the two-dimensional material may be a two-dimensional semiconductor identical to a semiconductor operating as a channel layer or may be a material different from the semiconductor operating as the channel layer.

In the embodiment of the present disclosure, a two-dimensional semiconductor thin film is synthesized by a method different from the conventional CVD or MOCVD to realize a suitable structure.

Figure 6A:
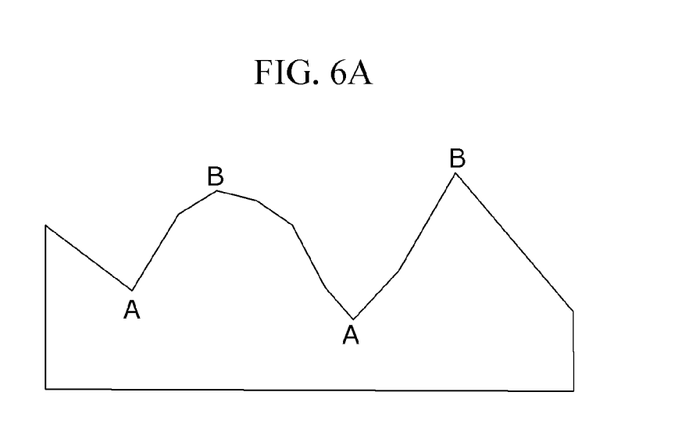
FIGS. 6A to 6C are views for describing a crystal structure of a thin film formed of a two-dimensional material and formed on a substrate on which uneven portions are formed.
Figure 6B:
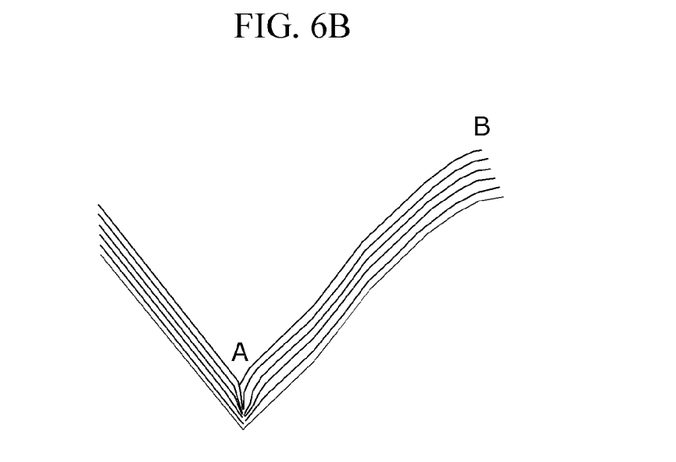
Figure 6C:
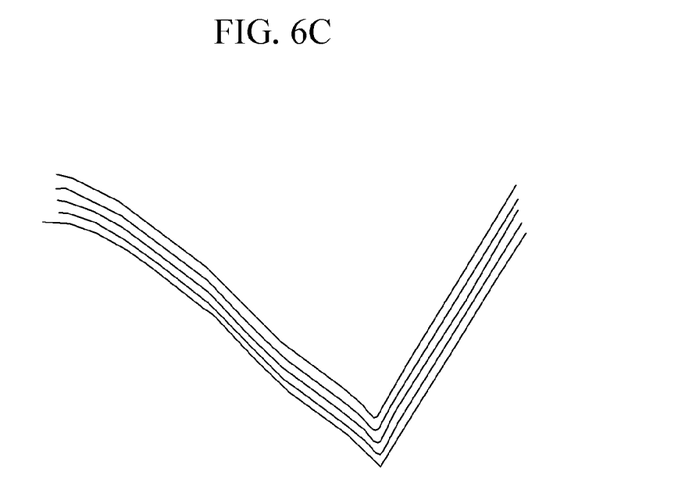

FIGS. 6A to 6C are views for describing the structure of the crystalline planes of a thin film formed of a two-dimensional material and formed on a substrate on which uneven portions are formed.

FIG. 6A is a view illustrating a substrate or an electrode material on which uneven portions are formed in an embodiment of the present disclosure, and FIG. 6B is a conceptual diagram of a growth structure of the crystalline planes of a two-dimensional material formed on a substrate along a curve. FIG. 6C is a conceptual diagram of a growth structure of the crystalline planes of a two-dimensional material manufactured by a CVD method.

In an embodiment of the present disclosure, hill portions B protruding convexly from surfaces of the uneven portions may easily alleviate volume expansion occurring when a metal is chalcogenated, and layers are formed vertically in recessed valley portions A.

The hill portions B and the valley portions A may be observed when a chalcogenide film having a thickness of at least 10 nm is formed on a flat substrate. However, as described above, even when a film is formed much thinner than 10 nm, the two-dimensional material may be made on such a significantly curved surface so as to have a structure of crystalline planes as illustrated in the valley portion A of FIG. 6B. When the two-dimensional material is manufactured to have such a crystal structure, contact resistance between adjacent layers may be significantly improved.

Meanwhile, the embodiment of the present disclosure aims to significantly improve contact resistance by forming uneven portions on a contact surface between neighboring layers to insert a metal chalcogen thin film without forming a thick film of 10 nm or more.

On the other hand, in the case of MOCVD, CVD, PECVD, or the like, since layers grow one layer by one layer from the beginning, the layers are formed horizontally along a surface thereof as illustrated in FIG. 6C. Even when a shape of the surface of the layer is rough and the substrate has a structure having an acute angle as illustrated in FIG. 6B, the shape as shown in FIG. 6B may not be obtained.

Hereinafter, a specific embodiment of the present disclosure will be described with reference to FIGS. 7A and 7B.

Figure 7A:
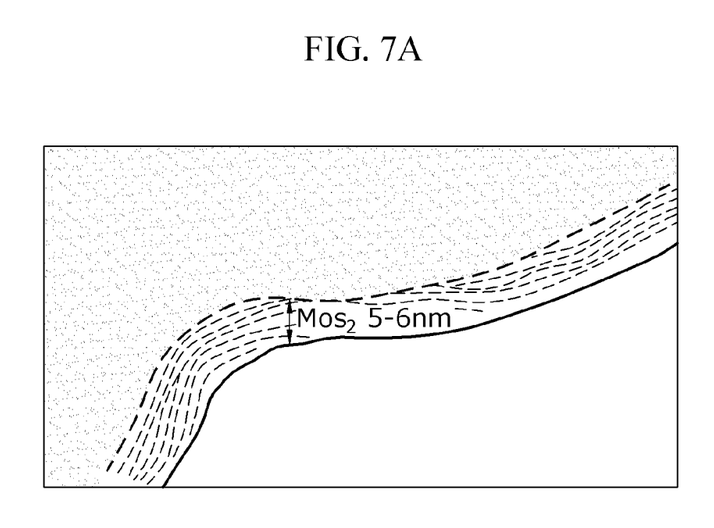
FIGS. 7A and 7B illustrate conceptual images copying out transmission electron microscopy (TEM) photographs showing a formed metal chalcogen film according to an embodiment of the present disclosure.
Figure 7B:
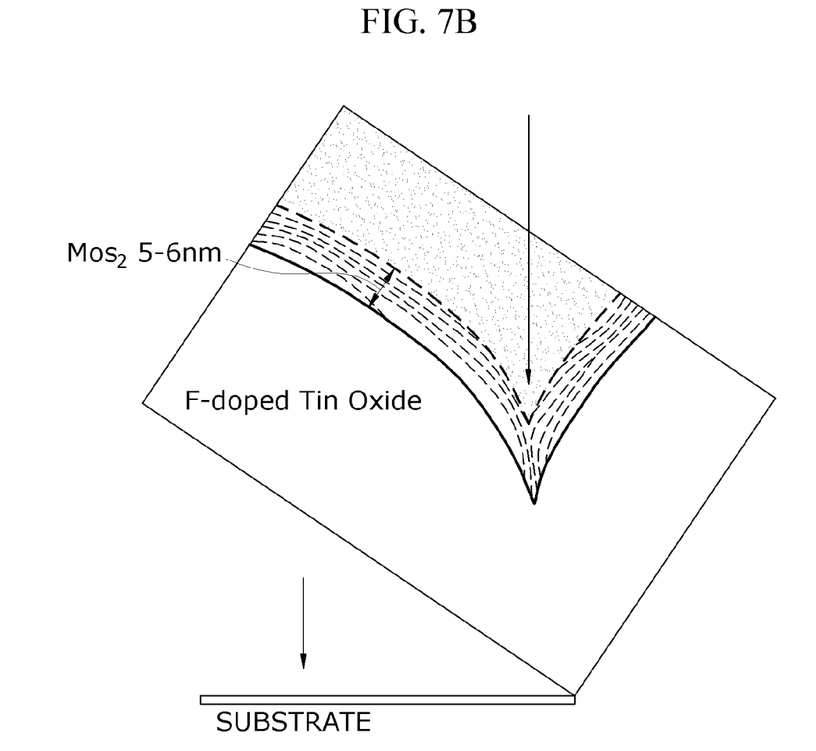

FIGS. 7A and 7B illustrate cross sectional images copying out transmission electron microscopy (TEM) photographs of a formed metal chalcogen film according to an embodiment of the present disclosure.

FIGS. 7A and 7B are the image of the TEM photograph obtained by actually forming $MoSe_2$, which is a kind of a two-dimensional semiconductor, on a curved substrate.

A Mo metal was deposited at a thickness of about 1.5 nm to 2 nm using an electron beam evaporator and then selenized at a substrate temperature of 530° C. Then, curved portions of a specimen were observed using a TEM.

First, referring to FIG. 7A, a $MoSe_2$ thin film having a thickness of about 5 nm to 6 nm was formed on a surface of a gentle hill-shaped surface and exhibited a shape formed to be parallel to a surface of the substrate as if the $MoSe_2$ thin film is formed on a flat substrate.

On the other hand, referring to FIG. 7B, in a valley-shaped portion P1, a crystal surface was formed in a region oriented perpendicular to the substrate along the valley portion P1 as illustrated in the cross sectional image and thus had a shape that very easily transfers charges along the crystalline planes to the substrate.

The shape of the valley portion P1 had an acute angle of about 60 degrees. A vertically oriented region was effectively formed in a valley having an acute angle of approximately less than 90 degrees. However, since the vertically oriented region was not as effective as in the case of an acute angle less than 90 degrees but was formed only by having an angle less than 180 degrees or more desirably 120 degrees, the contact resistance was partially improved.

In the embodiment of the present disclosure, in order to have the shape as illustrated in FIG. 7B, a technique should be used in which a metal precursor or a precursor film formed of a partially oxidized metal was first formed as a precursor and then a metal chalcogen film having a two-dimensional layered structure was formed by performing a subsequent chalcogenation process.

On the other hand, when a two-dimensional material film is formed by CVD, which is a method most commonly used in the art, the shape as illustrated in FIG. 7B may not be obtained.

According to the embodiment of the present disclosure, since the semiconductor device is disposed in the middle, not all the resistance in a vertical direction is due to the contact resistance. However, in relative comparison, when the present disclosure is applied to the same semiconductor device, the resistance is reduced to 1/10 or less, which means that an on-current may be increased by 10 times or more. In conclusion, it can be confirmed that performance of the device is significantly improved.

According to a conventional process, it forms a thin film of a two-dimensional material having crystalline layer structure parallel to a direction of a substrate. But according to any one of the embodiments of the present disclosure described above, the crystalline planes are oriented in the direction to guide the carries to flow along the planes vertically oriented to the electrodes by introducing a substrate or the layer having a high surface curvature. Therefore, contact resistance of the electrodes can be significantly improved.

The above description is only exemplary, and it will be understood by those skilled in the art that the disclosure may be performed in other concrete forms without changing the technological scope and essential features. Therefore, the above-described embodiments should be considered as only examples in all aspects and not for purposes of limitation. For example, each component described as a single type may be realized in a distributed manner, and similarly, components that are described as being distributed may be realized in a coupled manner.

The scope of the present disclosure is defined not by the detailed description but by the appended claims, and encompasses all modifications or alterations derived from meanings, the scope and equivalents of the appended claims.

What is claimed is:

1. A method of manufacturing a semiconductor device, the method comprising:
   providing a substrate;
   forming uneven portions in a region of the substrate in which an electrode is to be formed;
   forming a precursor film of a two-dimensional material on the substrate including the uneven portions;
   forming a metal chalcogen film by performing a chalcogenation process on the formed precursor film; and
   forming the electrode on a part of the formed metal chalcogen film,
   wherein the forming of the two-dimensional material on the substrate on which the uneven portions are formed includes forming the two-dimensional material film in regions including one or more contact regions and a channel region, and
   wherein the forming of the metal chalcogenide film by performing the chalcogenation process of the formed precursor film includes:
   forming a two-dimensional material layer including crystalline planes oriented in a direction parallel to the substrate in the channel region; and
   forming two-dimensional material layers including crystalline planes oriented in a direction perpendicular to the substrate in valley portions of the contact regions.

2. The method of claim 1, wherein the electrode is formed on the substrate.

3. The method of claim 1, wherein the forming of the uneven portions in the region of the substrate in which the electrode is to be formed includes forming the uneven portions in a predetermined region of a surface of a dielectric film.

4. The method of claim 1, wherein the forming of the two-dimensional material on the substrate including the uneven portions includes forming an ultra-thin metal film or an ultra-thin film of a partially oxidized metal, which is a precursor to become a two-dimensional material.

5. The method of claim 1, the resistivity of precursor films may be in the range of $1\times10^{-5}$ $\Omega\cdot$cm-10 $\Omega\cdot$cm.

6. The method of claim 1, wherein one or more two-dimensional materials are stacked in the contact regions.

7. The method of claim 1, wherein:
   the contact regions include one or more two-dimensional materials among $MoS_2$, $MoSe_2$, $MoTe_2$, $WSe_2$, $WS_2$, $WTe_2$, $ZrS_2$, $ZrSe_2$, $ZrTe_2$, $HfSe_2$, $HfS_2$, $HfTe_2$, $SnS_2$, $SnSe_2$, $SnTe_2$, $InSe_2$, $InS_2$, $InTe_2$, $TiS_2$, $TiSe_2$, $TiTe_2$, $NbS_2$, $NbSe_2$, $NbTe_2$, $TaS_2$, $TaSe_2$, $TaTe_2$, $ReS_2$, $ReSe_2$, $ReTe_2$, $VS_2$, $VSe_2$, and $VTe_2$; and
   the channel region includes one or more two-dimensional materials among $MoS_2$, $MoSe_2$, $MoTe_2$, $WSe_2$, $WS_2$, $WTe_2$, $ZrS_2$, $ZrSe_2$, $ZrTe_2$, $HfSe_2$, $HfS_2$, $HfTe_2$, $SnS_2$, $SnSe_2$, $SnTe_2$, $InSe_2$, $InS_2$, $InTe_2$, $TiS_2$, $TiSe_2$, $TiTe_2$, $NbS_2$, $NbSe_2$, $NbTe_2$, $TaS_2$, $TaSe_2$, $TaTe_2$, $ReS_2$, $ReSe_2$, $ReTe_2$, $VS_2$, $VSe_2$, and $VTe_2$.

8. The method of claim 7, wherein one or more two-dimensional materials are stacked in the channel region.

9. The method of claim 1, wherein the forming of the uneven portions in the region of the substrate on which the electrode is to be formed includes forming a lower electrode having the uneven portions formed in advance.

10. The method of claim 9, further comprising forming semiconductor layers including one or more layers on the lower electrode.

11. The method of claim 1, wherein a thickness of the metal chalcogenide film ranges from 0.6 nm to 20 nm.

12. The method of claim 1, wherein valley portions of the uneven portions have an angle of 120 degrees or less.

* * * * *